US 6,638,846 B2

(12) United States Patent
Iwata et al.

(10) Patent No.: US 6,638,846 B2
(45) Date of Patent: Oct. 28, 2003

(54) METHOD OF GROWING P-TYPE ZNO BASED OXIDE SEMICONDUCTOR LAYER AND METHOD OF MANUFACTURING SEMICONDUCTOR LIGHT EMITTING DEVICE

(75) Inventors: Kakuya Iwata, Tsukuba (JP); Paul Fons, Tsukuba (JP); Koji Matsubara, Tsukuba (JP); Akimasa Yamada, Ibaraki (JP); Shigeru Niki, Tsukuba (JP); Ken Nakahara, Kyoto (JP)

(73) Assignee: National Institute of Advanced Industrial Science and Technology and Rohm Co., Ltd., Tokyo (JP)

( * ) Notice: Subject to any disclaimer, the term of this patent is extended or adjusted under 35 U.S.C. 154(b) by 0 days.

(21) Appl. No.: 09/950,830

(22) Filed: Sep. 13, 2001

(65) Prior Publication Data

US 2002/0034861 A1 Mar. 21, 2002

(30) Foreign Application Priority Data

Sep. 13, 2000 (JP) .......................................... 2000-278042

(51) Int. Cl.$^7$ ........................... H01L 21/44; H01L 29/12
(52) U.S. Cl. ........................ 438/608; 438/603; 438/606; 257/43
(58) Field of Search ................................. 438/508, 518, 438/22, 30, 46, 603, 608; 257/43, 102, 200, 631

(56) References Cited

PUBLICATIONS

T. Yamamoto et al., "Solution using a codoping method to Unipolarily for the fabrication of p–type ZnO" Japanese Journal of Applied Physics, Feb. 1999, vol. 38, pp. 166–169.*

K. Adachi et al., "ZnO films deposited by APCVD" Photovoltaic Specialist Conference of IEEE, 1999, vol. 2, pp. 1385–1388.*

S. Nakao et al., "Change inoptical properties of sapphire substrates by co–implantation of high–energy Zn and O ions" Microprocessors and Nanotechnology Conference of IEEE, 1999, pp. 148–149.*

* cited by examiner

Primary Examiner—Matthew Smith
Assistant Examiner—Calvin Lee
(74) Attorney, Agent, or Firm—Arent Fox Kintner Plotkin & Kahn

(57) ABSTRACT

A ZnO based oxide semiconductor layer is grown on a sapphire substrate 1 by supplying, for example, raw materials made of Zn and O constituting ZnO and a p-type dopant material made of N without supplying an n-type dopant material (a-step). By stopping the supply of the material of O and further supplying an n-type dopant material made of Ga, the semiconductor layer is doped with the p-type dopant and the n-type dopant, thereby forming a p-type ZnO layer (2$a$) (b-step). By repeating the steps (a) and (b) plural times, a p-type ZnO based oxide semiconductor layer is grown. As a result, N to be the p-type dopant can be doped in a stable carrier concentration also during high temperature growth in which a residual carrier concentration can be reduced, and the carrier concentration of the p-type layer made of the ZnO based oxide semiconductor can be increased sufficiently.

5 Claims, 8 Drawing Sheets

3:1

2:1

1.3:1

○ DONOR  ● ACCEPTOR

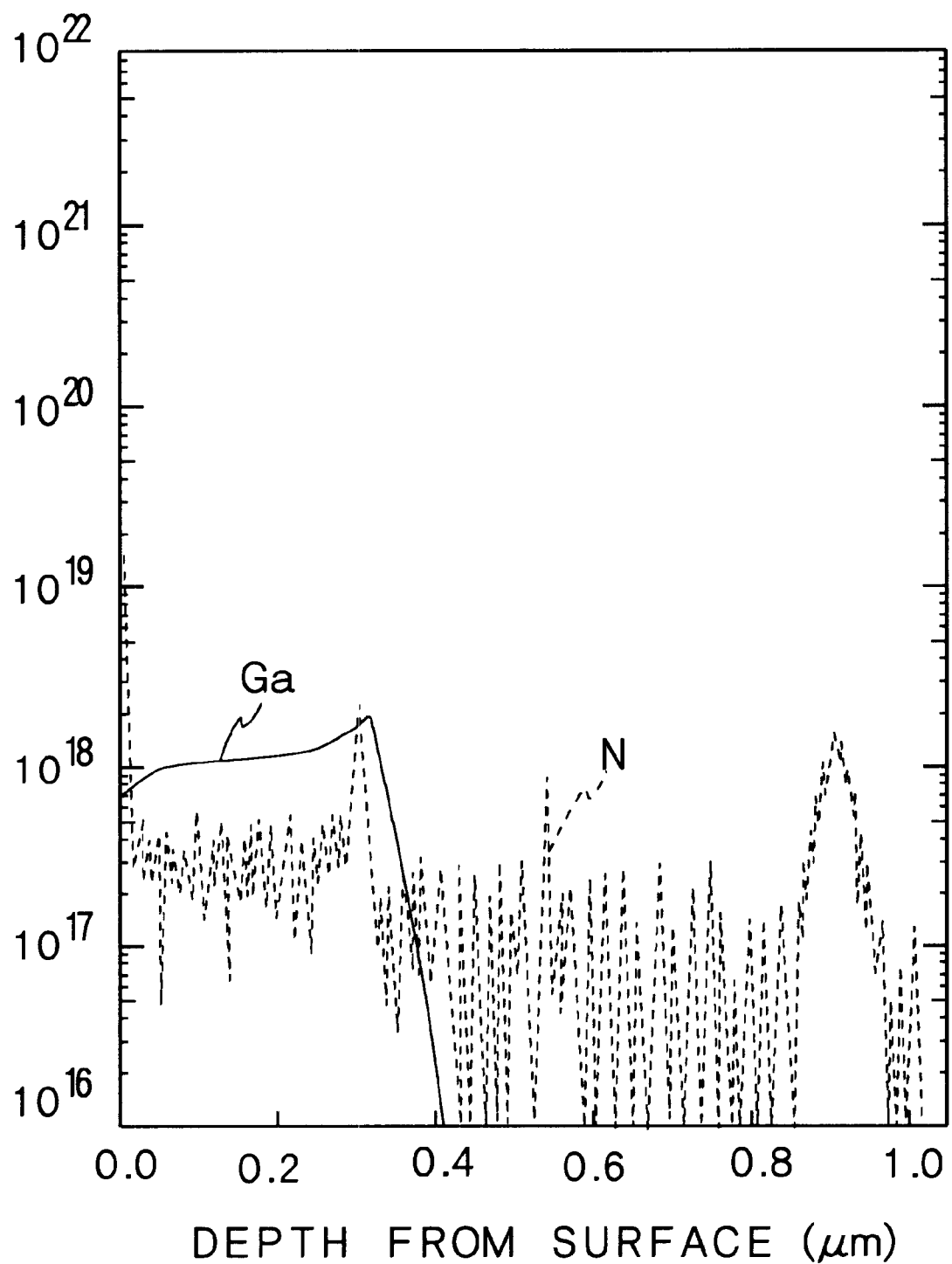

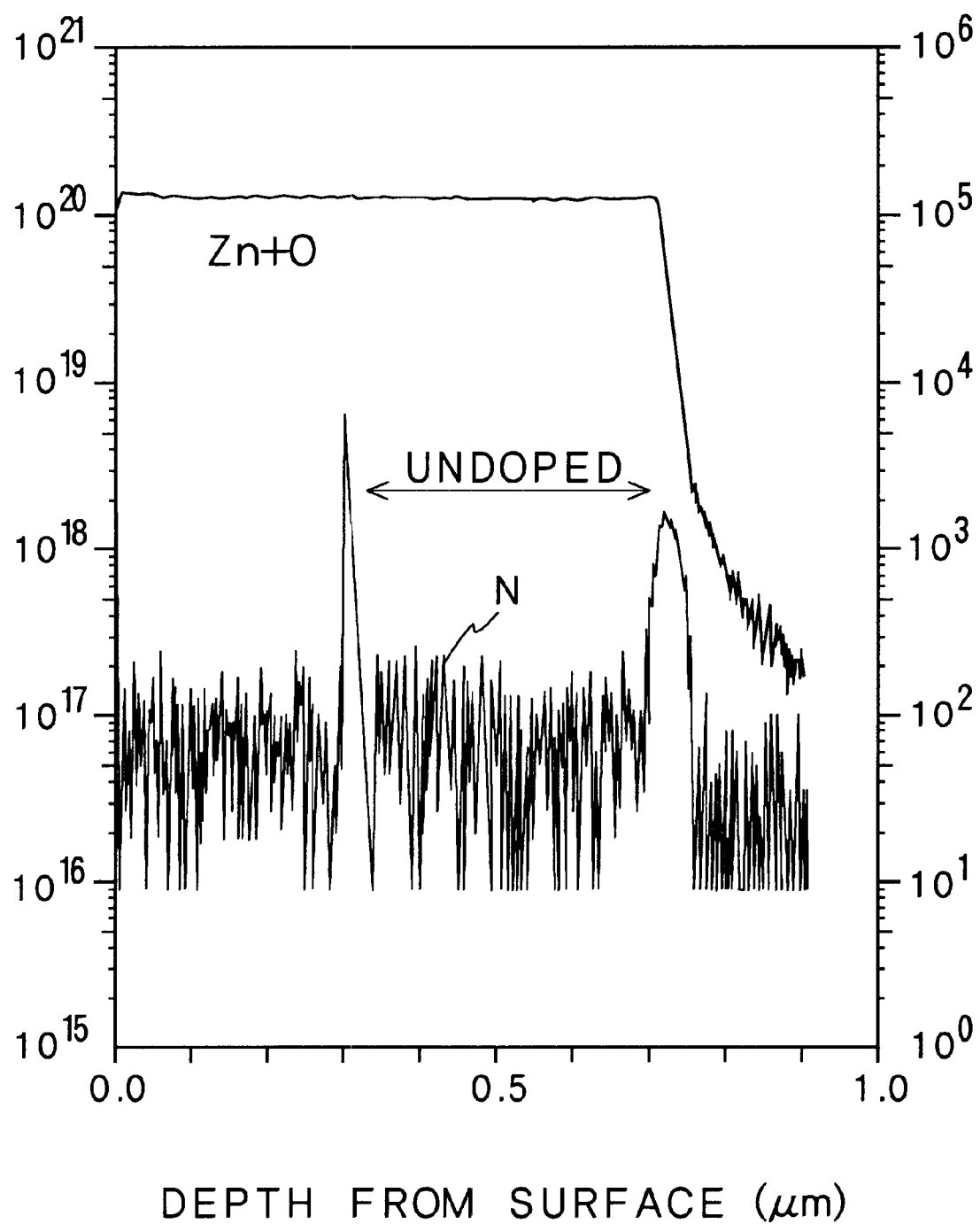

METHOD OF GROWING P-TYPE ZNO BASED OXIDE SEMICONDUCTOR LAYER AND METHOD OF MANUFACTURING SEMICONDUCTOR LIGHT EMITTING DEVICE

FIELD OF THE INVENTION

The present invention relates to a method of growing a p-type ZnO based oxide semiconductor layer in which a p-type ZnO based oxide semiconductor layer is grown with a high carrier concentration and a method of manufacturing a semiconductor light emitting device using the same. More specifically, the present invention relates to a method of growing a p-type ZnO based oxide semiconductor layer in which the acceptor level of a p-type dopant is reduced and p-type dopants are doped to fully act as acceptors, thereby sufficiently increasing a carrier concentration thereof and a method of manufacturing a semiconductor light emitting device using the same.

BACKGROUND OF THE INVENTION

A blue color based (a wavelength region from ultraviolet to yellow) light emitting diode (hereinafter referred to as an LED) to be used for a full color display, a signal light or the like and a blue laser diode (hereinafter referred to as an LD) for a very fine DVD light source for a next generation which continuously oscillates at a room temperature can be obtained by laminating GaN based compound semiconductor layers on a sapphire substrate and have recently attracted the attention. While the GaN based compound semiconductor is in major in the light emitting device having a short wavelength, it has also been investigated that a II-VI compound semiconductor such as ZnO is used. The ZnO has a band gap of 3.37 eV at a room temperature and it has also been expected that the ZnO based oxide can be applied to a transparent conductive film, a transparent TFT and the like in addition to the DVD light source.

In ZnSe, a p-type semiconductor layer to be the II-VI compound has been implemented by activating a nitrogen gas using a plasma and doping the activated nitrogen. However, the same method has been tried for the ZnO and a p-type layer having a high carrier concentration has not been implemented. For example, it is apparent that an N concentration obtained by SIMS when growing a ZnO layer while supplying a ZnO material and plasma nitrogen to be a p-type dopant at a high substrate temperature of 500 to 60° C. is very small like a noise as shown in FIG. 9 together with a secondary ion strength of ZnO. In FIG. 9, there is a portion in which the N concentration has a maximum value based on the fact that a substrate is once taken out of a growing apparatus in order to grow an undoped ZnO layer and an N-doped p-type layer and to recognize a boundary thereof. However, it is apparent that the N concentration is rarely varied between the undoped layer and the p-type layer. The reason why the N concentration is very noisy in FIG. 9 is that a concentration is low and close to the limit of the measurement based on the SIMS.

Although the reason is not definite, for example, it has been published that nitrogen entering an oxygen site of ZnO (the condition of p-type conduction) creates a deep acceptor level of approximately 200 meV, and furthermore, makes crystal structure unstable and generates an oxygen hole so that doping of ZnO with nitrogen becomes hard in "Solution using a codoping method to Unipolarity for the fabrication of p-type ZnO" (Japanese Journal of Applied Physics, Vol. 38, pp. 166 to 169, 1999) written by T. Yamamoto et al. As one of the solutions, the paper has proposed a codoping method for simultaneously doping nitrogen to be an acceptor and a III group element to be a donor. More specifically, there have been described the effect of mutually bonding a III group element and nitrogen through codoping to enter into a ZnO crystal lattice, thereby preventing the instability of crystals from being caused by nitrogen doping and the effect of reducing the acceptor level.

As described above, it has been proposed that a III group element such as Ga to be an n-type dopant is simultaneously doped in addition to nitrogen to be a p-type dopant in order to form the p-type ZnO based oxide semiconductor layer. However, there is a problem in that a p-type layer having a high carrier concentration cannot be obtained even if the nitrogen and the III group element such as Ga are actually doped simultaneously. In particular, although the present inventors have found that a residual carrier concentration is reduced when a ZnO based oxide is grown at a high temperature of 500° C. or more, during a high temperature epitaxial growth, particularly, an oxidation speed is higher than a nitrogenization speed. Therefore, there is a problem in that Ga is more doped than main N even if the simultaneous doping is carried out, as shown in FIGS. 7 and 8 showing the concentrations of Ga and N obtained by the simultaneous doping at 600° C. FIG. 7 shows that a larger amount of Ga is doped than that in FIG. 8 and N is also doped more easily if the amount of Ga to be doped is increased. However, the concentration of N does not exceed that of Ga.

SUMMARY OF THE INVENTION

In consideration of the circumstances, it is an object of the present invention to provide a method of growing a p-type ZnO based oxide semiconductor layer capable of doping N to be a p-type dopant at a stable carrier concentration and sufficiently increasing the carrier concentration of the p-type layer made of ZnO based oxide semiconductor, by employing a simultaneous doping method in high temperature growth in which a residual carrier concentration can be reduced.

It is another object of the present invention to provide a method of manufacturing a semiconductor light emitting device which can grow a p-type ZnO based oxide semiconductor layer having a high carrier concentration, thereby obtaining a semiconductor light emitting device such as a light emitting diode or a laser diode which is excellent in a light emitting efficiency.

The present inventors investigated to solve the reason why a p-type ZnO based oxide semiconductor layer having a sufficiently high carrier concentration cannot be obtained by codoping. As a result it was found that the chemical activity of oxygen is very high on the condition that Zn, O, N to be a p-type dopant and Ga to be an n-type dopant coexist and grow, for example, so that a reaction of ZnO and GaO is caused much more early than that of ZnN and GaN.

In other words, the following is apparent from the theory of the above-mentioned paper. Even if N alone enters into the site of O of a ZnO crystalline structure, the crystalline structure becomes unstable or an acceptor level becomes too deep, which is not preferable. By doping Ga, a Ga-N bond is formed and if the amount of N becomes larger than that of Ga, the doped N can effectively act as an acceptor with an —N—Ga—N— bond. However, even if N and Ga are simply supplied, the reaction of ZnO and GaO proceeds early so that the —N—Ga—N— bond cannot be obtained and Ga is replaced with Zn to obtain an —O—Zn—O—Ga—O— structure and to act as an n-type dopant. Therefore, the p-type layer is adversely affected.

The present inventors found that at least the supply of an O material is stopped to carry out the doping when supplying a Ga material so that an —N—Ga—N— bond is obtained and is further combined with O of a ZnO semiconductor layer and N is bonded to Ga with a bond of —O—Zn—N—Ga—N—Zn—O— so that a p-type ZnO semiconductor layer acting as an effective acceptor can be obtained.

The present invention provides a method of growing a p-type ZnO based oxide semiconductor layer wherein when a p-type dopant material made of N and an n-type dopant material are to be simultaneously supplied to grow the p-type ZnO based oxide semiconductor layer, at least the supply of O in raw materials constituting a ZnO based oxide is stopped when supplying the n-type dopant material, and thereby carrying out growth.

The ZnO based oxide semiconductor means an oxide containing Zn, and specifically includes an oxide of IIA group and Zn, IIB group and Zn or IIA and IIB groups and Zn in addition to ZnO, respectively.

By using the method, as described above, the bond of Zn or the III group element and O is suppressed and the bond of N to be the p-type dopant and the III group element such as Ga to be the n-type dopant is obtained and is replaced with a ZnO based crystal, and therefore acts as an effective p-type dopant having a shallow acceptor level.

More specifically, the growth can be carried out by repeating a step of growing a ZnO based oxide semiconductor layer while supplying the p-type dopant material made of N together with the raw materials constituting the ZnO based oxide and a step of stopping supply of at least O in the raw materials constituting the ZnO based oxide, and supplying the n-type dopant material made of a III group element.

In another method the growth can be carried out by repeating a step of growing a ZnO based oxide semiconductor layer by supplying the raw materials constituting the ZnO based oxide without supplying any dopant materials and a step of stopping supply of at least O in the raw materials constituting the ZnO based oxide, and supplying the p-type dopant material made of N and the n-type dopant material made of the III group element.

It is preferable that a time required for supply or an amount of the supply should be regulated such that the p-type dopant material made of N is more supplied than the n-type dopant material made of the III group element.

The present invention provides a method for manufacturing a semiconductor light emitting device, in which semiconductor layers made of a ZnO based oxide semiconductor having at least an n-type layer and a p-type layer are provided on a surface of a substrate so as to form a light emitting layer forming portion, wherein the p-type layer is formed by the method according to any methods described above.

BRIEF DESCRIPTION OF THE DRAWINGS

FIG. 8 is a chart showing the N concentration and the Ga concentration of ZnO layer which is grown by carrying out the simultaneous doping according to the conventional art.

FIG. 9 is a chart showing the N concentration and the secondary ion strength of ZnO of a ZnO layer which is obtained by growing the conventional ZnO layer with only plasma nitrogen at a high temperature of 500 to 600° C.

DETAILED DESCRIPTION

Next, a method of growing a p-type ZnO based oxide semiconductor layer and a method of manufacturing a semiconductor light emitting device according to the present invention will be described with reference to the drawings.

Figure 1:
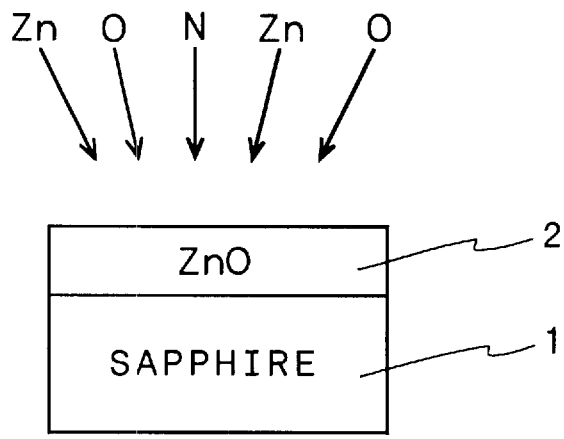
FIGS. 1(a) and 1(b) are conceptual views illustrating a method of growing a p-type ZnO oxide semiconductor layer according to the present invention.
Figure 1:
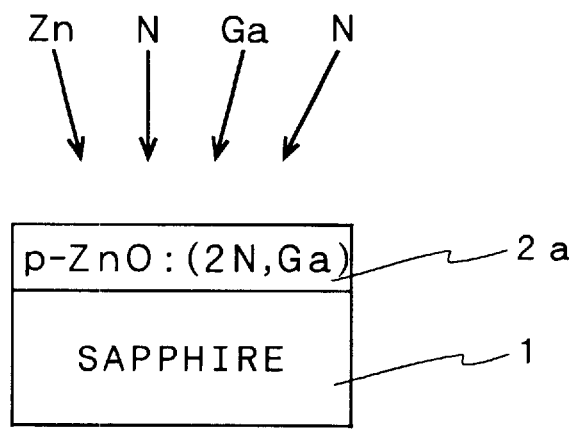

In the method of growing a p-type ZnO based oxide semiconductor layer according to the present invention, as shown in the view illustrating the conceptual step of growing p-type ZnO in FIGS. 1(a) and 1(b), an n-type dopant material is not supplied but a ZnO based oxide, for example, material Zn and O constituting ZnO and N to be a p-type dopant are supplied to grow a ZnO based oxide semiconductor layer on a sapphire substrate 1 by the MBE (Molecular Beam Epitaxial) method, for example (FIG. 1(a)). Then, the supply of the material of O is stopped and the material of Ga to be an n-type dopant is further supplied, thereby doping the semiconductor layer with the p-type dopant and the n-type dopant. Consequently, a p-type ZnO layer 2a is obtained (FIG. 1(b)). By repeating the steps (a) and (b) plural times, the p-type ZnO based oxide semiconductor layer is grown.

As described above, the present inventors vigorously made investigations in order to obtain the p-type ZnO based oxide semiconductor layer. As a result, it was found that even if N to be the p type dopant and the III group element such as Ga are doped simultaneously at the step of growing an ordinary ZnO based oxide, Zn and Ga are bonded to O earlier so that a bond of Ga—N cannot be obtained and N is singly replaced with Zn to be a dopant having a deep acceptor level or Ga—O is obtained to be an n-type dopant so that a p-type carrier concentration cannot be enhanced.

More specifically, as is apparent from the fact that all substances are influenced by natural oxidation, oxygen has a very high chemical activity so that the reaction of Zn—O and III group-O occurs earlier than that of ZnN and III group-N in a state in which nitrogen or the III group element to be a dopant and oxygen coexists. In order to support the presumption, actually, when a gas of $N_2O$ is changed into a plasma to grow, ZnN is not produced, and ZnO is grown. It is effectively supposed that $N_2O$ changed into a plasma has such a shape as to overlap the plasmas of an $N_2$ gas and an $O_2$ gas each other, that is, $N_2O$ plasma=N* (active N)+O*

(active O) is obtained. In other words, it is indicated that the reaction with oxygen occurs earlier.

Accordingly, if the III group element and N to be the dopant are supplied together with oxygen to be one of the raw materials of ZnO, the bond of the III group element and N cannot be obtained and the object of codoping cannot be attained. By separately setting the step of the growth of the ZnO based oxide semiconductor layer and the step of stopping the supply of O and doping the III group element such as Ga, and gradually repeating the steps as described above, a p-type ZnO layer having a very high carrier concentration can be obtained.

After the temperature of the substrate is raised to a predetermined temperature by the MBE device, for example, Zn and O* (a plasma oxygen) to be raw materials for ZnO and N to be a p-type dopant are supplied to grow a ZnO layer 2 (a step) and the supply of O* is then stopped and Ga is supplied, thereby carrying out simultaneous codoping (b step). By repeating both steps based on the supply schedule of each material shown in FIG. 4(*a*), a p-type ZnO layer 2*a* having a thickness of approximately 0.8 μm is grown. The N concentration (atoms/cm$^3$) of the ZnO layer thus grown is investigated by the SIMS (secondary ion mass spectrometer) analysis. The result of the investigation is shown in FIG. 5 in contrast with the secondary ion strength (counts/sec) of ZnO. As is apparent from FIG. 5, N having a concentration of $6\times10^{18}$ cm$^{-3}$ or more is taken into a crystal and a p-type ZnO layer having a high carrier concentration can be obtained.

Figure 4A:
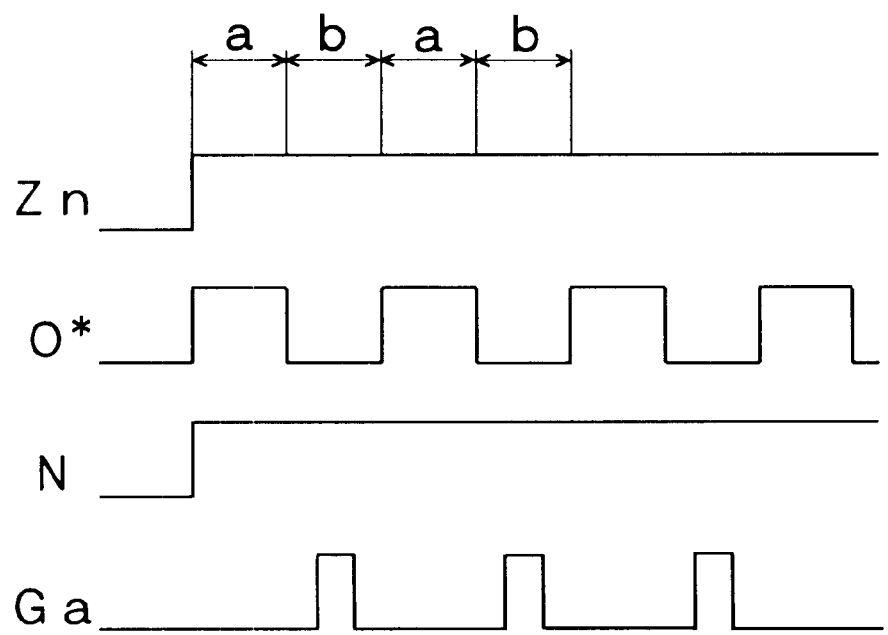
FIGS. 4(a) to 4(c) are diagrams showing an example of a time schedule in which each raw material is supplied when growing a p-type ZnO layer according to the present invention.
Figure 4B:
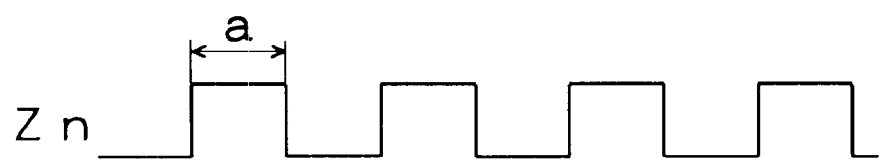
Figure 4C:
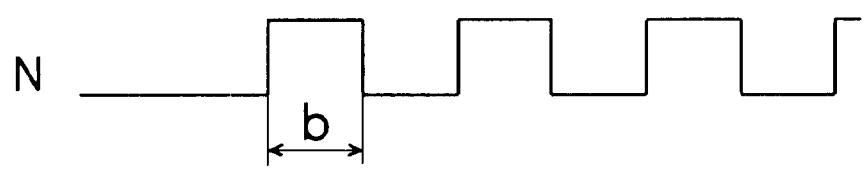
Figure 5:
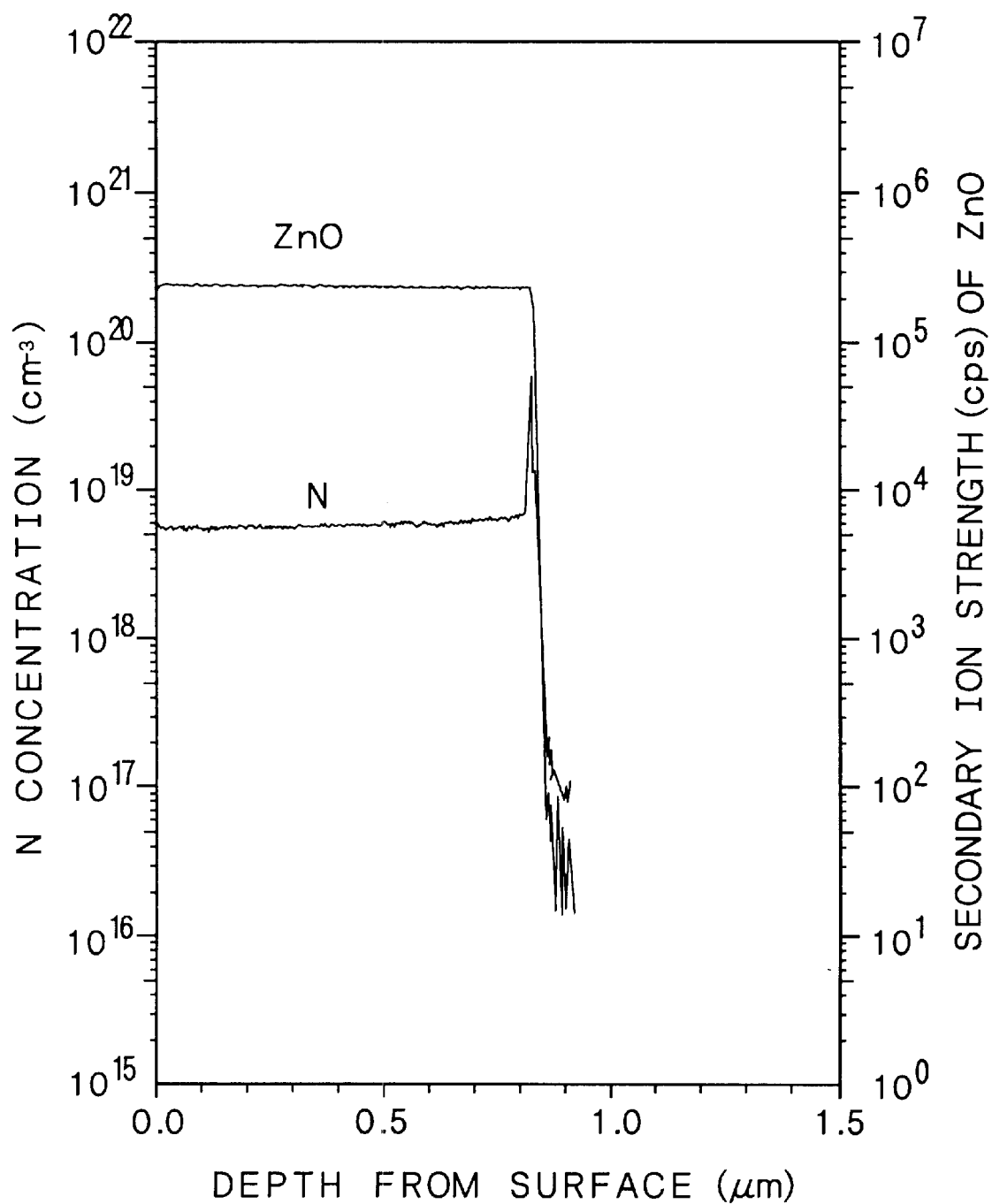
FIG. 5 is a chart showing, together with the secondary ion strength of ZnO, the N concentration of the p-type ZnO layer gown by repeating a step of growing a ZnO layer and a doping step according to the present invention.

While the supply of the material of O is stopped and Ga is supplied and doped with N in the above-mentioned example, the supply of the material of Zn may be stopped together with O based on the time schedule of the Zn supply shown in FIG. 4(*b*). Moreover, the material of N to be the p-type dopant is supplied during the growth of the ZnO layer, which is preferable because N to be the p-type dopant can easily be doped.

As shown in the time schedule of the N supply in FIG. 4(*c*), however, the supply of N may be started simultaneously with the stop of the supply of O*, while the supply of N is stopped during the growth of the ZnO layer. Consequently, there is less possibility that an acceptor having a deep level with N doped by itself might be obtained, which is preferable. In this case, in order to form a p-type layer, it is preferable that the doping should be carried out with N:Ga=approximately 2:1 when a time required for the supply of N is set to be longer than a time required for supplying Ga or the absolute amount of the supply of N is set to be larger than that of Ga to obtain the p-type ZnO layer as shown in FIGS. 4(*a*) and 4(*c*).

Figure 3A:
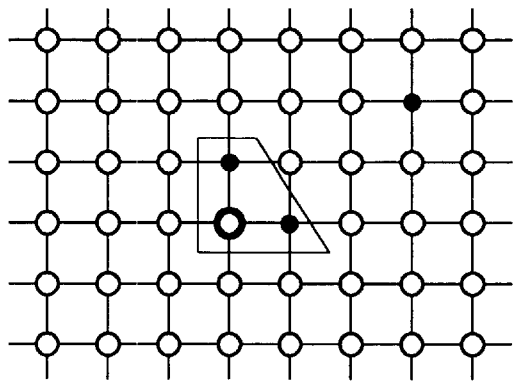
FIGS. 3(a) to 3(c) are diagrams showing a modeled 4-coordination compound indicating the possibility of the configuration of a donor and an acceptor which are to be doped in ZnO.
Figure 3B:
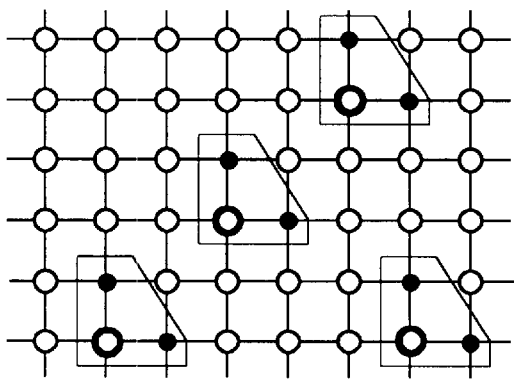
Figure 3C:
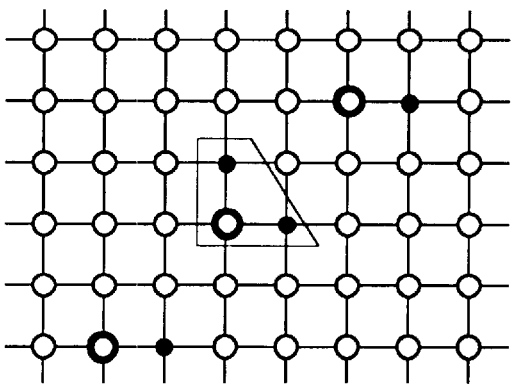

While N to be the p-type dopant and Ga to be the n-type dopant are supplied with approximately 2:1 in the above-mentioned example, three manners can be proposed for such a manner that the p-type dopant and the n-type dopant enter into a ZnO crystal lattice as shown in FIG. 3 illustrating an example in which a general 4-coordination compound is modeled two-dimensionally. More specifically, FIG. 3(*a*) shows an example in which a set having two acceptors (N), a donor (Ga) and an acceptor(N:Ga=3:1) is wholly present. If the number of the acceptors is increased, it is supposed that repulsive force between the acceptors is increased and a solubility almost reaches an upper limit.

In the example shown in FIG. 3(*b*), moreover, the set obtained by bonding two acceptors and one donor is present in the whole element (N:Ga=2:1) and a stable state is obtained on an energy basis. Moreover, FIG. 3(*c*) corresponds to an example in which a pair having two acceptors and one donor and two pairs of one acceptor and one donor are present (N:Ga=1.3:1) and the acceptors act at a minimum. In FIGS. 3(*a*) to 3(*c*), a white circle denotes an element constituting a compound, a white circle having the outside surrounded by a black circle denotes a donor (Ga) and a black circle denotes an acceptor (N). More specifically, it is preferable that respective dopants should be supplied with N:Ga=(1.3 to 3):1.

According to the present invention, when supplying the n-type dopant for codoping, the supply of O is stopped and a bond to O to be easily combined is carried out very slowly so that the III group element such as Ga is bonded to N and is doped into the ZnO based oxide. As a result, it is possible to prevent the instability of a crystal from being caused by doping N and to shallow the acceptor level. Furthermore, the acceptor can act very effectively and the carrier concentration of the p-type ZnO based oxide semiconductor layer can be increased greatly.

Moreover, the inventors vigorously made investigations in order to solve a problem in that the nitrogen to be the p-type dopant does not enter because the oxidation speed is higher than the nitrogenization speed when the ZnO based oxide semiconductor layer is grown at a high temperature of 400° C. or more to decrease residual carriers as described above. As a result of the investigations, it was found that the nitrogen is easily bonded to the III group element such as Ga by stopping the supply of oxygen as described above, and furthermore, Ga can be bonded to N by fully increasing the amount of the III group element such as Ga to be supplied and N can be doped as an acceptor.

In other words, Ga is a material for forming GaN with a reaction to N*. Therefore, Ga+N* reacts more easily than Zn+N*. However, if the amount of Ga is small, the reaction with O* occurs more easily and the relatively slow reaction of Ga+N* occurs with difficulty. When the amount of Ga is sufficiently increased, there is a room for causing the Ga+N* reaction in a next competitive process which is not so relatively slow. Therefore, it is supposed that the Ga—N bond is generated and doping is carried out easily.

Figure 6:
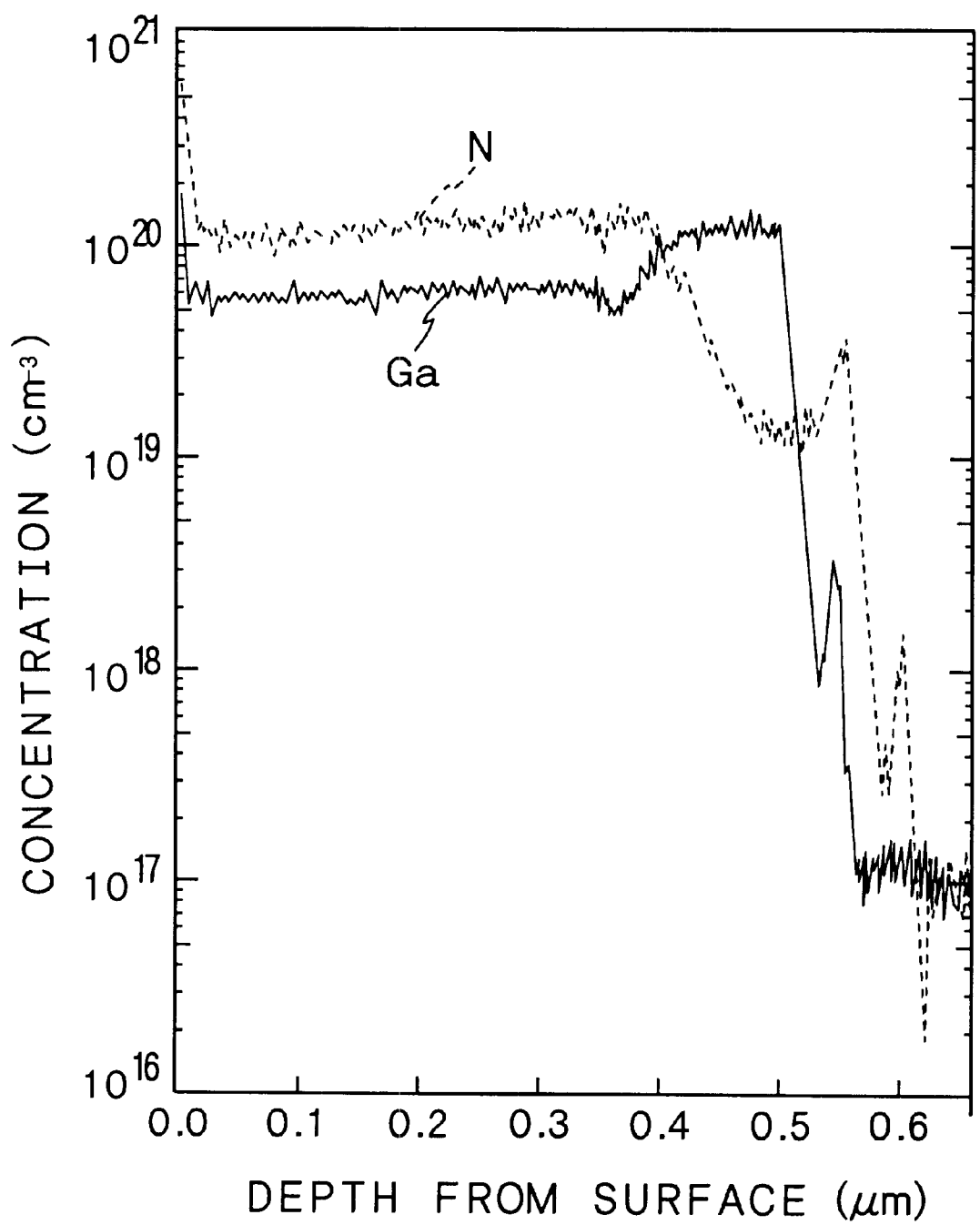
FIG. 6 is a chart showing, together with the secondary ion strength of ZnO, the N concentration of a ZnO layer which is grown at a high temperature of 600° C. by increasing the amount of Ga to be doped in simultaneous doping.
Figure 7:
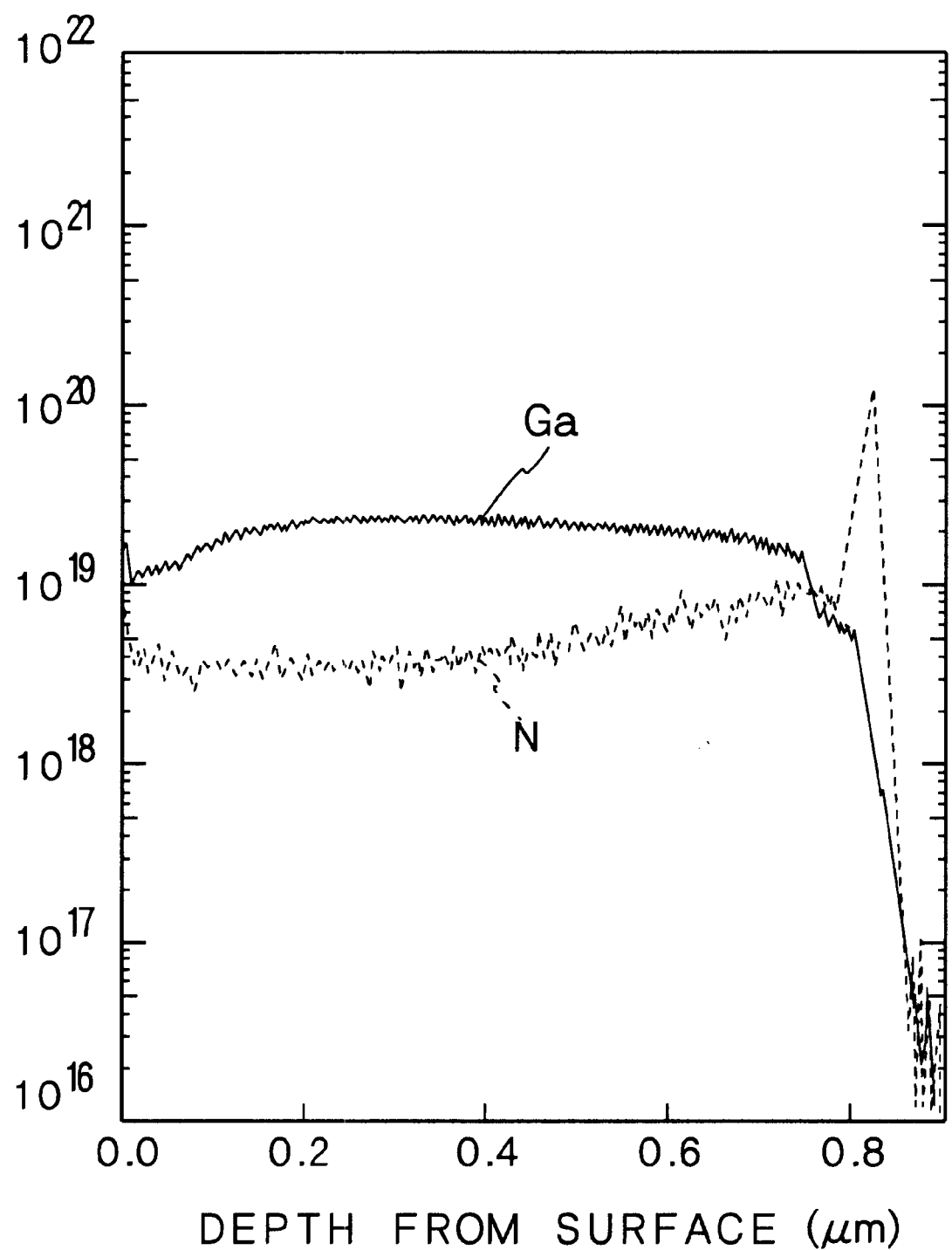
FIG. 7 is a chart showing the N concentration and the Ga concentration of ZnO layer which is grown by carrying out simultaneous doping according to the conventional art.

FIG. 6 shows a result obtained by investigating an N concentration and a secondary ion strength of ZnO by the SIMS in the same manner as described above in which the supply of O* is stopped during the supply of Ga and the amounts of Ga and N to be supplied are increased to form a p-type layer. As shown in FIG. 6, Ga having a concentration of approximately $5\times10^{19}$ cm$^{-3}$ is doped so that N is doped in a concentration of approximately $1\times10^{20}$ cm$^{-3}$, while it is apparently different from FIGS. 7 and 8 (the supply of O* is not stopped during the doping of Ga) that a far less amount of N is doped than that of FIG. 6.

Figure 2:
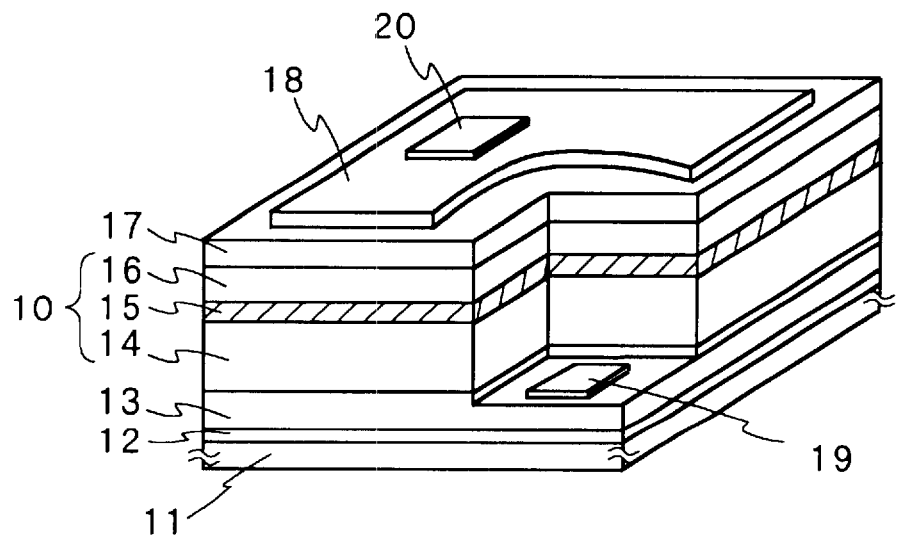
FIG. 2 is a view showing the structure of an LED chip according to an example of a light emitting device to be manufactured by the present invention.

FIG. 2 shows the sectional structure of a blue based (a wavelength region from ultraviolet to yellow) LED chip manufactured by growing the p-type ZnO based oxide semiconductor layer by using a ZnO based compound semiconductor. In order to manufacture the LED, for example, a sapphire substrate 11 is set into the MBE device and a substrate temperature is set to 600 to 700° C. to carry out thermal cleaning, and the substrate temperature is then set to approximately 400° C. and a buffer layer 12 formed of ZnO is formed in a thickness of approximately 50 nm to 0.1 μm.

Next, the substrate temperature is set to approximately 550 to 600° C., and the shutters of an oxygen radical source (cell) and a Zn source (cell) are opened to irradiate the oxygen radical and Zn again and the shutter of Al or Ga to be the n-type dopant is also opened to grow an n-type contact layer 13 formed of n-type ZnO in a thickness of approximately 1.5 µm. Then, the shutter of Mg is opened to grow an n-type cladding layer 14 formed of $Mg_yZn_{1-y}O$ ($0 \leq y < 1$, for example, y=0.15) in a thickness of approximately 2 µm, and the supply of Mg is stopped to open the shutter of Cd and grow an undoped active layer 15 formed of $Cd_xZn_{1-x}O$ ($0 \leq x < 1$, for example, x=0.08) in a thickness of approximately 0.1 µm.

Thereafter, the supply of Cd is stopped to open the shutter of Mg and the plasma excitation nitrogen of the p-type dopant and to grow a $Mg_yZn_{1-y}O$ ($0 \leq y < 1$, for example, y=0.15) layer and the supply of the oxygen radical is then stopped to open the shutter of Ga to be the n-type dopant so that the $Mg_yZn_{1-y}O$ layer is doped. By gradually repeating these two steps, a p-type cladding layer 16 formed of p-type $Mg_yZn_{1-y}O$ ($0 \leq y < 1$, for example, y=0.15) is grown in a thickness of approximately 2 µm. Furthermore, the supply of Mg is stopped and the growth of the ZnO layer and the supply of Ga are alternately repeated in the same manner. Consequently, a p-type contact layer 17 formed of p-type ZnO is sequentially grown in a thickness of approximately 1 µm. A light emitting layer forming portion 10 is constituted by the n-type cladding layer 14, the active layer 15 and the p-type cladding layer 16.

Subsequently, the supply of all the materials is stopped to slowly drop the substrate temperature at a rate of 5 to 10° C. every minute. After the substrate temperature is fully dropped, a wafer subjected to epitaxial growth is taken out of the MBE apparatus. Then, the wafer is put in a sputtering apparatus to provide an ITO film 18 to be a transparent conductive film in a thickness of approximately 0.15 µm. Thereafter, a part of the laminated semiconductor layers is subjected to dry etching such as a RIE method, thereby exposing the n-type contact layer 13 and polishing the sapphire substrate 11 to set the thickness of the substrate 11 to be approximately 100 µm. A p-side electrode 20 formed of Ni/Al and an n-side electrode 19 formed of Ti/Au are provided on the ITO film 18 and the surface of the n-type contact layer 13 exposed by the etching through vacuum evaporation using a lift-off method, for example, respectively. Subsequently, a chip is cut away from the wafer so that an LED chip shown in FIG. 2 is obtained.

While the light emitting layer forming portion 10 is an LED chip having a double hetero junction in this example, another junction structure such as a pn junction structure of a hetero junction or a homo junction may be used. Moreover, LD may be obtained in place of the LED. In this case, for example, it is preferable that the active layer 15 should be formed with a multi-quantum well structure in which two to five respectively barrier layers and well layers formed of non-doped $Cd_{0.03}Zn_{0.97}O/Cd_{0.2}Zn_{0.8}O$ are alternately provided in thicknesses of 5 nm and 4 nm, respectively.

Moreover, in the case in which the active layer 15 is thin and light cannot be fully confined in the active layer 15, light guide layers formed of ZnO are provided on both sides of the active layer, for example. Furthermore, the transparent electrode formed of the ITO film 18 is not required, and the p-side electrode 20 is directly formed by stripe-like patterning, the upper portion of the semiconductor layers is etched into a mesa shape or a current constricting layer is buried. Consequently, a structure for defining a current injection region is formed.

According to the present invention, it is possible to obtain a light emitting device using a ZnO based oxide semiconductor having a high p-type carrier concentration. Therefore, it is possible to obtain an LED having a very low operating voltage and a high light emission efficiency or an LD having a low operating voltage and a small threshold current.

Although the ZnO based compound semiconductor layer is grown on the sapphire substrate by the MBE method in the above-mentioned example, the step of growing a ZnO based oxide and the doping step can be repeated separately when forming a p-type layer in the same manner by the MOCVD method and the supply of a reaction gas of oxygen is stopped during the doping, thereby doping a p-type dopant in a very high concentration.

According to the present invention, when the n-type dopant is to be supplied through the simultaneous doping, the supply of O is stopped to carry out the doping. Therefore, it is possible to dope N to be the p-type dopant in a ZnO layer through bonding to the n-type dopant such as Ga. As a result, the doping concentration of N can be increased and the acceptor level thereof can be shallowed and the carrier can be operated sufficiently. Consequently, it is possible to easily obtain a p-type semiconductor layer having a high carrier concentration. Furthermore, it is possible to obtain a p-type ZnO based oxide layer having a high concentration in which N can be doped through the simultaneous doping in the high-temperature growth, the number of residual carriers is small and a carrier concentration is stable.

As a result, it is possible to obtain a semiconductor light emitting device in which a light emitting characteristic is greatly enhanced by growing the p-type layer of a semiconductor light emitting device such as an LED or an LD formed of a ZnO based oxide semiconductor by the method described above.

Although preferred examples have been described in some detail it is to be understood that certain changes can be made by those skilled in the art without departing from the spirit and scope of the invention as defined by the appended claims.

What is claimed is:

1. A method of growing a p-type ZnO based oxide semiconductor layer comprising the steps of:

supplying raw materials constituting a ZnO based oxide; and simultaneously supplying a p-type dopant material made of nitrogen and an n-type dopant material, wherein supply of at least oxygen in said raw materials constituting said ZnO based oxide is stopped when supplying said n-type dopant material, thereby carrying out growth.

2. The growing method of claim 1, wherein the growth is carried out by repeating a step of growing a ZnO based oxide semiconductor layer while supplying said p-type dopant material made of nitrogen together with said raw materials constituting said ZnO based oxide and a step of stopping supply of at least oxygen in said raw materials constituting said ZnO based oxide, and supplying said n-type dopant material made of a group III element.

3. The growing method of claim 1, wherein the growth is carried out by repeating a step of growing a ZnO based oxide semiconductor layer by supplying said raw materials constituting a ZnO based oxide semiconductor layer by supplying said raw materials constituting said ZnO based oxide without supplying any dopant materials and a step of stopping supply of at least oxygen in said raw materials constituting said ZnO based oxide, and supplying said p-type dopant material made of nitrogen and said n-type dopant material made of a group III element.

4. The growing method of claim 1, wherein a time required for supply or an amount of the supply is regulated such that said p-type dopant material made of nitrogen is more supplied than said n-type dopant material made of group III element.

5. The method of manufacturing a semiconductor light emitting device, in which semiconductor layers made of ZnO based oxide semiconductor and having at least an n-type layer and p-type layer are provided on a surface of a substrate so as to form a light emitting layer forming portion, wherein said p-type layer is formed by the method according to any of claim 1 to 4.

* * * * *

UNITED STATES PATENT AND TRADEMARK OFFICE
CERTIFICATE OF CORRECTION

PATENT NO. : 6,638,846 B2
DATED : October 28, 2003
INVENTOR(S) : Iwata et al.

It is certified that error appears in the above-identified patent and that said Letters Patent is hereby corrected as shown below:

<u>Title page,</u>
Item [73], Assignees, please change the Assignees to read:
-- National Institute of Advanced Industrial Science and Technology, Tokyo (JP) and Rohm Co., Ltd., Kyoto (JP) --.

Signed and Sealed this

Twenty-seventh Day of January, 2004

JON W. DUDAS
*Acting Director of the United States Patent and Trademark Office*